(12) United States Patent
Sundby

(10) Patent No.: US 7,646,224 B2
(45) Date of Patent: Jan. 12, 2010

(54) MEANS TO DETECT A MISSING PULSE AND REDUCE THE ASSOCIATED PLL PHASE BUMP

(75) Inventor: James Toner Sundby, Tracy, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 11/744,386

(22) Filed: May 4, 2007

(65) Prior Publication Data

US 2008/0272808 A1 Nov. 6, 2008

(51) Int. Cl.
*H03L 7/06* (2006.01)
(52) U.S. Cl. .................. 327/156; 327/18; 327/147; 375/373
(58) Field of Classification Search .......... 327/18, 327/147, 156
See application file for complete search history.

(56) References Cited

U.S. PATENT DOCUMENTS 6,744,838 B1 * 6/2004 Dixit ........................ 375/373
2005/0110526 A1 * 5/2005 Ishibashi et al. ............ 327/18

* cited by examiner

*Primary Examiner*—Lincoln Donovan
*Assistant Examiner*—John W Poos
(74) *Attorney, Agent, or Firm*—Townsend and Townsend and Crew LLP

(57) ABSTRACT

A phase/frequency locked loop (PLL) includes circuitry adapted to detect missing pulses of a reference clock and to control the phase bump of the PLL. The circuitry includes, in part, first and second flip-flops, as well as a one-shot block. The first flip-flop has a data input terminal responsive to a voltage supply, and a clock terminal responsive to an inverse of feedback clock. The second flip-flop has a data input terminal responsive to an output of the first flip-flop, and a clock terminal responsive to the inverse of the feedback clock. The one-shot block generates a pulse in response to a rising edge of the reference clock that is used to generate the feedback clock. The one-shot block generates an output signal applied to a reset terminal of the first flip-flop.

12 Claims, 6 Drawing Sheets

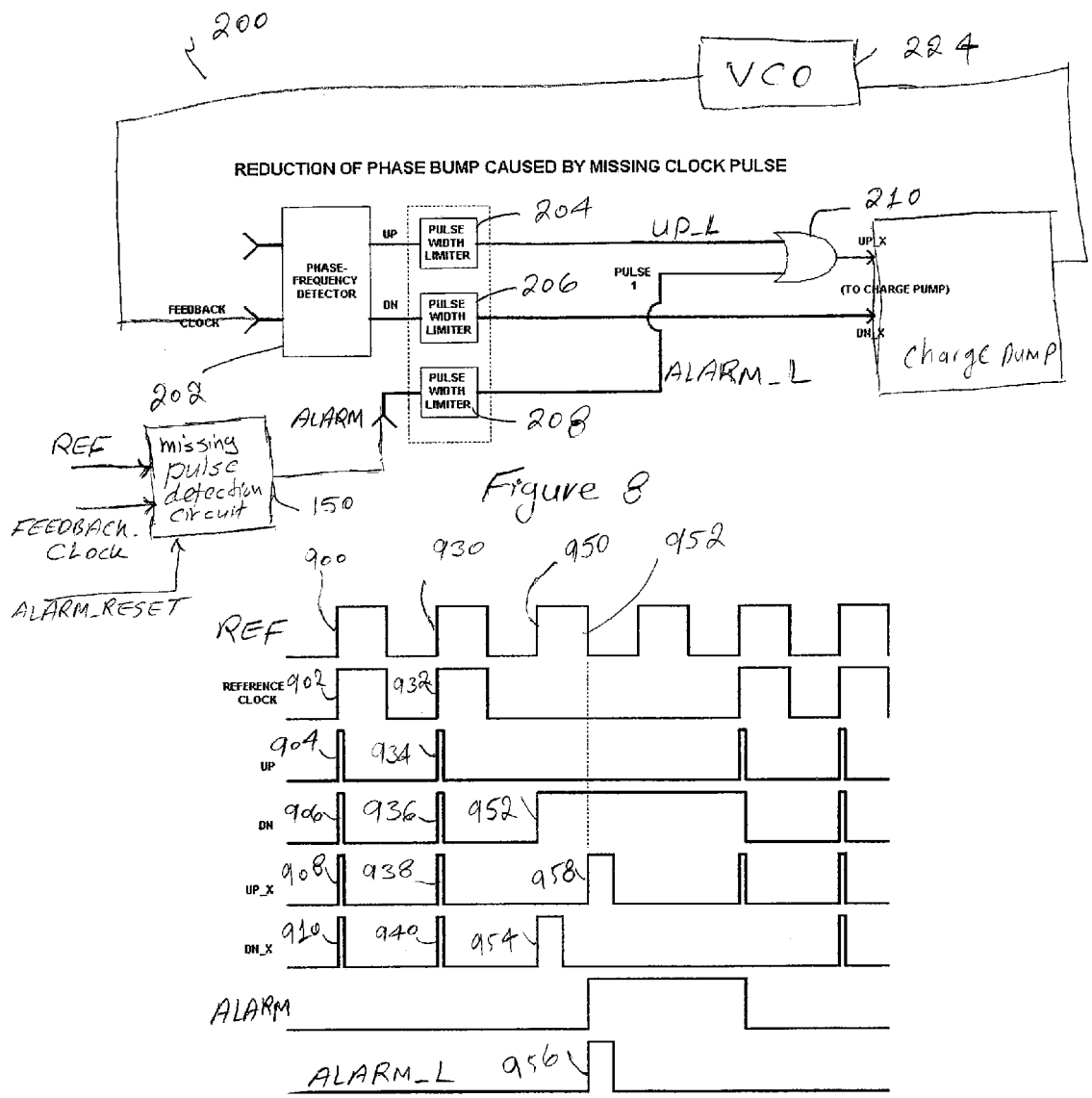
Figure 8
Figure 9
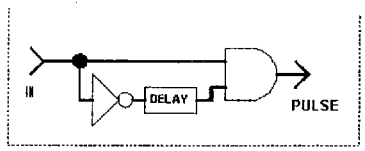
Figure 10

US 7,646,224 B2

MEANS TO DETECT A MISSING PULSE AND REDUCE THE ASSOCIATED PLL PHASE BUMP

BACKGROUND OF THE INVENTION

The present invention relates to electronic circuits, and more particularly to controlling the phase bump a phased locked loop.

A phase locked loop maintains a fixed relationship between the phase and frequency of the signal it receives and those of the signal it generates. FIG. 1 is a simplified block diagram of a conventional phase locked loop (PLL) 100 adapted to maintain a fixed relationship between the phase and frequency of signal CLK and signal REF. PLL 100 includes, among other components, phase detector 102, charge pump 104, loop filter 106 and voltage controlled oscillator (VCO) 108. The extracted clock signal Clk is supplied at the output terminal of VCO 108. The operation of PLL 10 is described further below.

Phase detector 102 receives signals REF and Clk, and in response, generates signals UP and DN that correspond to the difference between the phases of the signals REF and Clk. Charge pump 104 receives signals UP and DN and in response varies the current it supplies to node Vcntrl. Loop filter 106 stores the charge as a voltage, which is then delivered to VCO 108.

If signal REF leads signal Clk in phase—indicating that the VCO is running relatively slowly—the duration of pulse signal UP increases, thereby causing charge pump 104 to increase its net output current I until VCO 108 achieves an oscillation frequency at which signal Clk is frequency-locked and phase-locked with signal REF. If, on the other hand, signal REF lags signal Clk in phase—indicating that the VCO is running relatively fast—the duration of pulse signal DN increases—thereby causing VCO 108 achieve an oscillation frequency at which signal Clk is frequency-locked and phase-locked with signal REF. Signal Clk is considered to be locked to signal REF if its frequency is within a predetermined frequency range of signal REF and the phase of signals CLK and REF are aligned. Signal Clk is considered to be out-of-lock with signal REF if its frequency is outside the predetermined frequency range of signal REF.

When the input reference clock to a PLL changes phase, the PLL must slew to the new phase. Such a condition may happen when, for example, the PLL switches from one reference clock to another clock with the same frequency but a different phase. Such a condition may also happen if the clock that the PLL switches to has a different frequency than the clock the PLL switches from. Furthermore, in some applications it is desirable to have the PLL output clock switch slowly, and not rapidly, to the new phase so as to enable other down-stream circuits to maintain proper operation.

When the input clock to a PLL misses a pulse or becomes inactive, the output of the Phase-Frequency detector 102 gets stuck in the down state until such time as the input clock becomes active again. Referring to FIGS. 1 and 2 concurrently, a clock signal, such as $REF_{ideal}$, applied to a PLL ideally should not have missing pulses. However, in practical applications, a clock signal such as $REF_{actual}$, actually received by a PLL includes missing pulses. The phase of the feedback signal CLK generated in response to clock signal $REF_{actual}$ begins to vary as a result of the missing pulses. These phase shifts $\Delta\phi_1$ and $\Delta\phi_2$ are shown in FIG. 2 relative to the ideal clock signal $REF_{ideal}$.

When signal DN remains in a high state as a result of the missing pulses, the charge pump disposed in the PLL starts to remove charge from the loop filter. This causes signal Vcntrl generated by charge pump 104 to droop, in turn causing the VCO output phase to move away from its ideal value.

In accordance with the technique described in U.S. Pat. No. 6,393,596, missing pulses are detected by applying the reference clock to a filter and applying the filter's output to a comparator. Missing pulses cause the output voltage of the filter to shift. When the output voltage of the filter exceeds a threshold value, the comparator trips to indicate the detection of missing pulses. One drawback of this technique is that the filter reduced the sensitivity of the detection circuit, rendering it slow to respond. Accordingly, a number of missing pulses may be required before the detection.

In accordance with the technique described in U.S. Pat. No. 6,590,949, the reference clock signal is digitally compared against the feedback clock. However, detection is made only after a number of transitions of the reference clock signal have been missing.

BRIEF SUMMARY OF THE INVENTION

A phase/frequency locked loop (PLL) includes a circuit adapted to detect missing pulses of a reference clock applied to the PLL. The circuit includes, in part, first and second flip-flops, as well as a one-shot block. The first flip-flop has a data input terminal responsive to a voltage supply, and a clock terminal responsive to an inverse of a feedback clock. The second flip-flop has a data input terminal responsive to an output of the first flip-flop, and a clock terminal responsive to the inverse of the feedback clock. The one-shot block generates a pulse in response to a rising edge of the reference clock that is used to generate the feedback clock. The one-shot block generates an output signal applied to a reset terminal of the first flip-flop.

The circuit further includes, in part, third and fourth flip-flops. The third flip-flop has a data input terminal responsive to the voltage supply, and a clock terminal responsive to the feedback clock. The fourth flip-flop has a data input terminal responsive to an output of the third flip-flop and a clock terminal responsive to the feedback clock. The reset terminal of the third flip-flop receives the output signal of the one-shot block.

The circuit further includes, in part, fifth and sixth flip-flops as well as a second one-shot block. The fifth flip-flop has a data input terminal responsive to the voltage supply, and a clock terminal responsive to the inverse of feedback clock. The sixth flip-flop has a data input terminal responsive to an output of the fifth flip-flop, and a clock terminal responsive to the inverse of the feedback clock. The second one-shot block generates a pulse in response to a falling edge of the reference clock. The second one-shot block generates an output signal applied to a reset terminal of the fifth flip-flop.

The circuit further includes, in part, seventh and eight flip-flops. The seventh flip-flop has a data input terminal responsive to the voltage supply, and a clock terminal responsive to the feedback clock. The eight flip-flop has a data input terminal responsive to an output of the seventh flip-flop and a clock terminal responsive to the feedback clock. The reset terminal of the seventh flip-flop receives the output signal of the second one-shot block.

The circuit further includes, in part, first, second and third logic gates. The first logic gate performs a NOR operation on output signals of the second and fourth flip-flops. The second logic gate performs a NOR operation on output signals of the sixth and eight flip-flops. The third logic gate performs a NAND operation on output signals of the first and second logic gates. A cross-coupled NOR logic also disposed in the circuit is responsive to an output of the third logic gate. The reset terminals of the second, fourth, sixth and eight flip-flops are responsive to a reset signal to which said cross-coupled NOR logic is also responsive.

The PLL embodying the circuit further includes, in part, a phase/frequency detector responsive to a phase/frequency of each said feedback and the reference clock, a first pulse-width limiter adapted to generate a second pulse in response to a first output of the phase/frequency detector, a second pulse-width limiter adapted to generate a third pulse in response to a second output of the phase/frequency detector, a third pulse-width limiter adapted to generate a fourth pulse in response to an alarm signal; and a fourth logic gate performing an OR operation on said second and fourth pulses. The PLL further includes a charge pump responsive to the second pulse and the fourth logic gate; and an oscillator adapted to generate the feedback clock in response to the charge pump.

BRIEF DESCRIPTION OF THE DRAWINGS

FIG. 8 is a block diagram of a PLL in which the circuit of FIG. 3 is disposed, in accordance with one embodiment of the present invention.

FIG. 9 is a timing diagram of a number of signals associated with the PLL of FIG. 8, in accordance with one embodiment of the present invention.

FIG. 10 is a block diagram of a pulse-width limiter disposed in the PLL of FIG. 8, in accordance with one embodiment of the present invention.

DETAILED DESCRIPTION OF THE INVENTION

Figure 1:
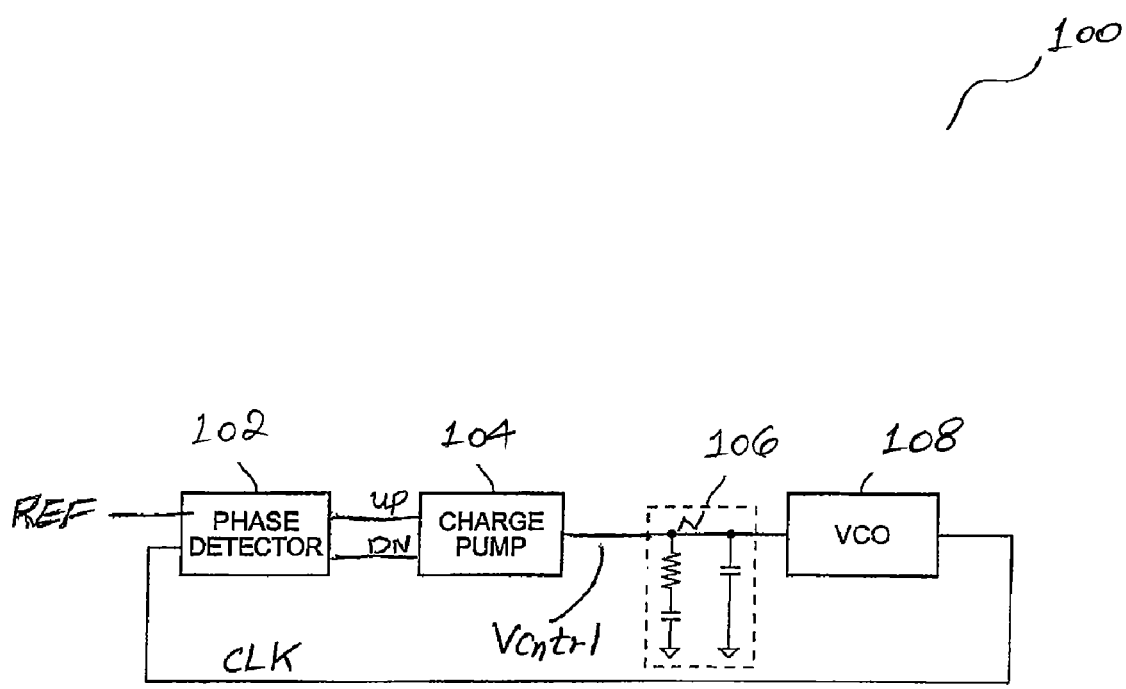
FIG. 1 is a block diagram of a PLL, as known in the prior art.
Figure 2:
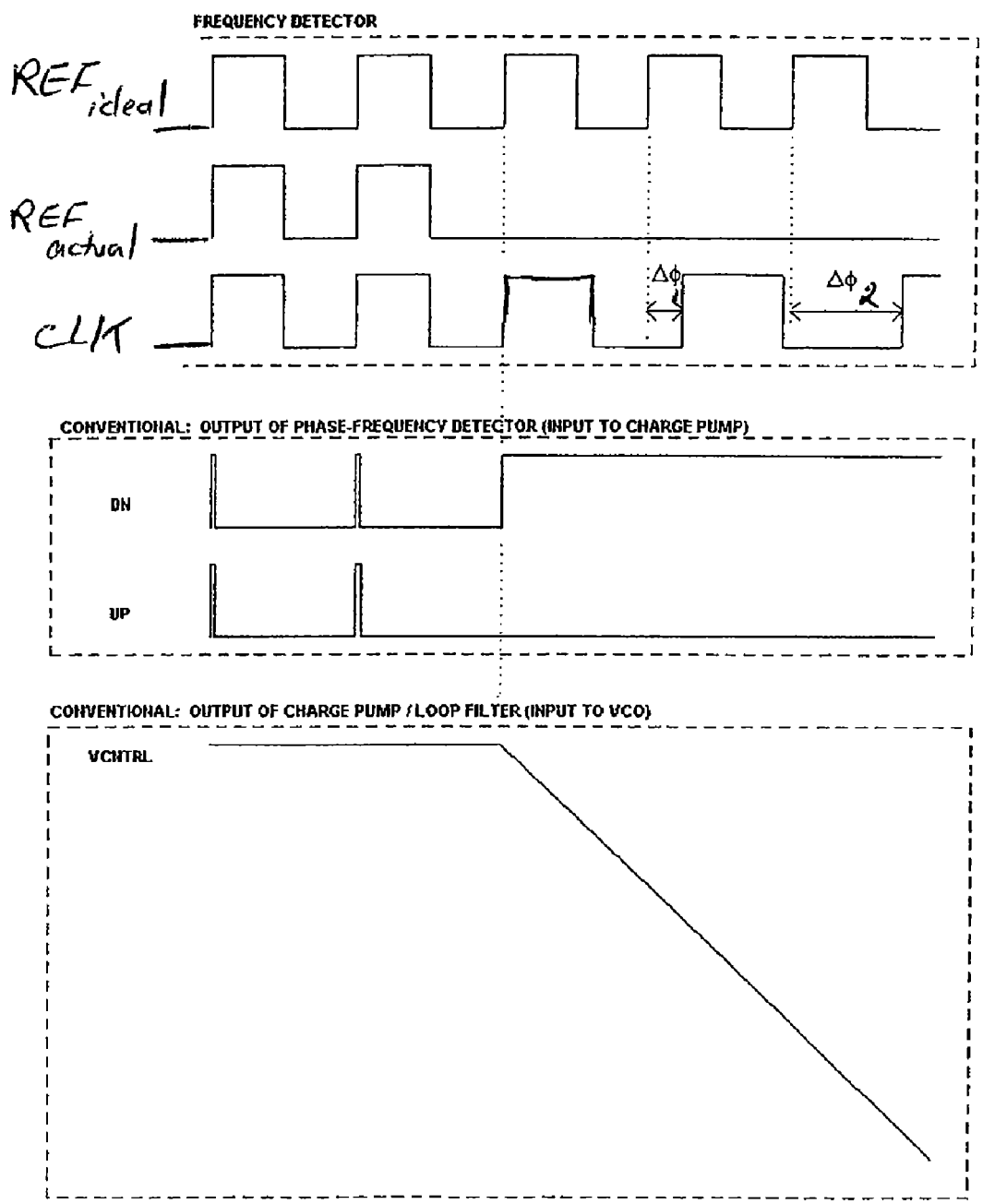
FIG. 2 is a timing diagram of a number of signals associated with the PLL of FIG. 1.
Figure 3:
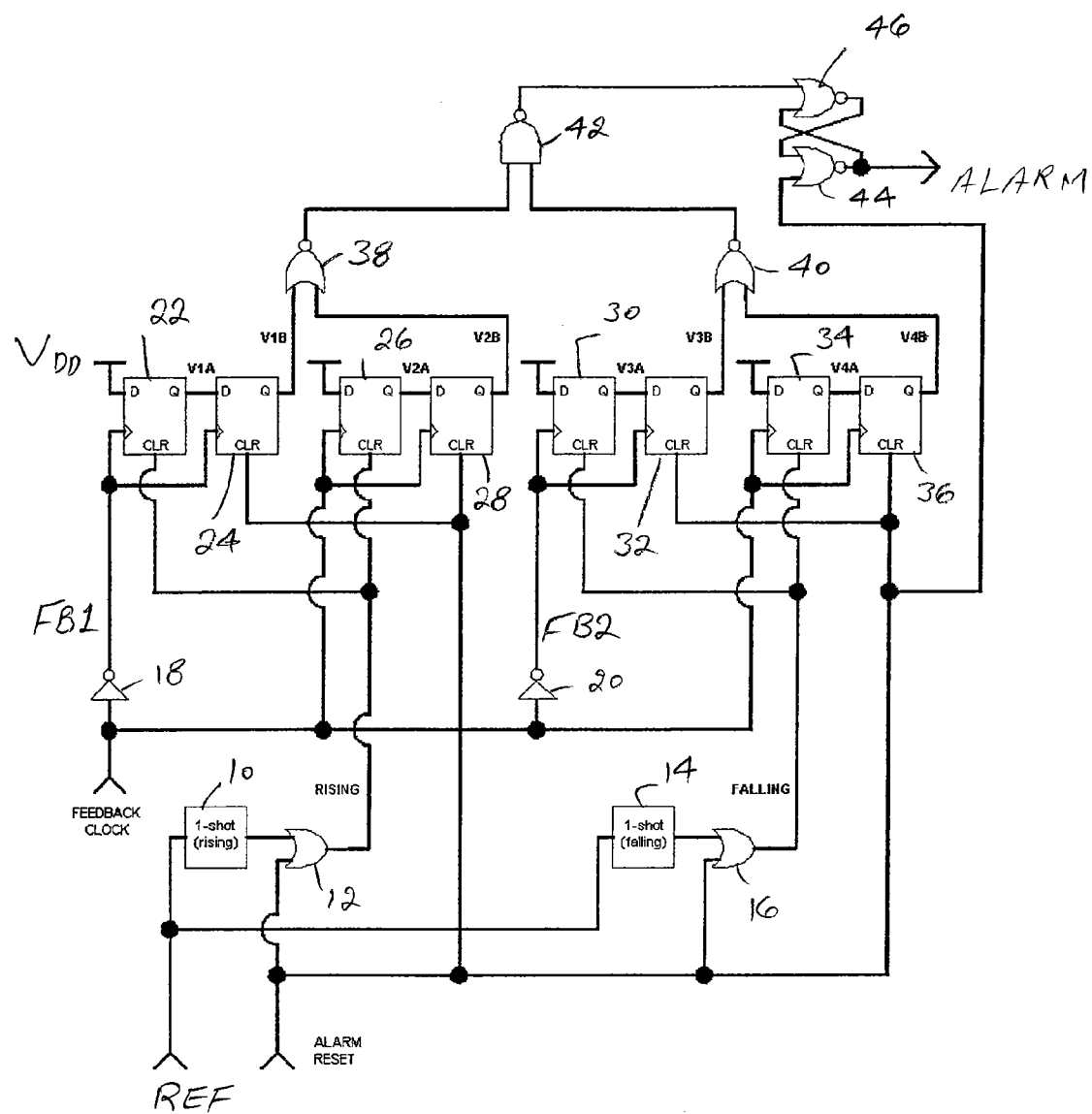
FIG. 3 is a schematic diagram of a missing pulse detection circuit, in accordance with one embodiment of the present invention.

FIG. 3 is a schematic diagram of a missing pulse detection circuit 150, in accordance with one embodiment of the present invention. When a missing pulse is detected by circuit 150, the output signal Alarm of NOR gate 44 is set. Output signal ALARM is reset when signal ALARM_RESET applied to OR gate 12 is asserted.

One-shot block 10 generates a pulse on each rising edge of the reference clock signal REF and applies this pulse to OR gate 12. Likewise, one-shot block 14 generates a pulse on each falling edge of the reference clock signal REF and applies this pulse to OR gate 16. The output signal RISING of OR gate 12 is applied to the clear input terminals CLR of flip-flops 22 and 26. The output signal FALLING of OR gate 16 is applied to the clear input terminals CLR of flip-flops 30 and 34. Signal ALARM_RESET is applied to the CLR input terminals of flip-flops 24, 28, 32 and 36.

The input clock terminals of flip-flops 22 and 24 receive clock signal FB1 that is the inverse of feedback clock FEEDBACK_CLOCK supplied by the VCO disposed in a PLL embodying circuit 150. The input clock terminals of flip-flops 30 and 32 receive clock signal FB2 that is the inverse of clock FEEDBACK_CLOCK. Signal FEEDBACK_CLOCK is applied to the clock input terminals of flip-flops 26, 28, 34 and 36. The output data of flip-flop 22 is applied to the input data of flip-flop 24; the output data of flip-flop 26 is applied to the input data of flip-flop 28; the output data of flip-flop 30 is applied to the input data of flip-flop 32; the output data of flip-flop 34 is applied to the input data of flip-flop 36. The output data of flip-flops 24 and 28 are applied to NOR gate 38. The output data of flip-flops 32 and 36 are applied to NOR gate 40. The outputs of NOR gates 38 and 40 are applied to NAND gate 42 whose output is applied to cross-coupled NOR gates 44, 46. NOR gate 44 generates output signal ALARM, as described above. Flip-flops 22, 24, 26, 28, 30, 32, 34 and 36 are reset when their respective reset signal CLR is asserted.

Figure 4:
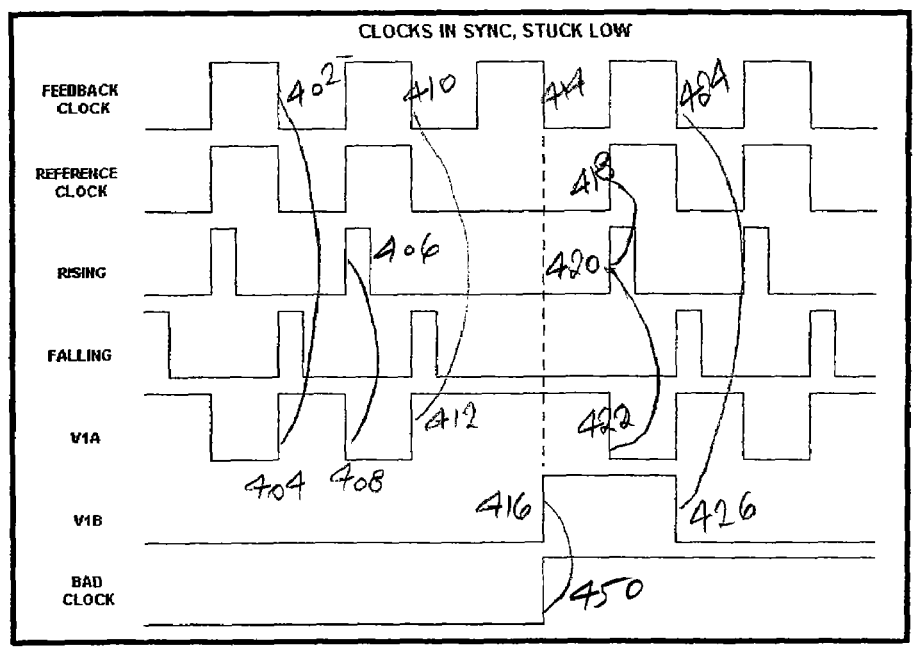
FIG. 4 is a timing diagram of a number of signals associated with circuit of FIG. 3 when the reference clock signal is initially in sync with the feedback clock signal but is subsequently stuck in a high level.

FIG. 4 is a timing diagram of a number of signals associated with circuit 150 when the reference clock REF is initially in sync with the feedback clock FEEDBACK_CLOCK but is subsequently stuck in a low level. Referring concurrently to FIGS. 3 and 4, with each rising edge of the reference clock signal REF, a RISING pulse is generated. Similarly, with each falling edge of the reference clock signal REF, a FALLING pulse is generated. Because the feedback clock signal generated by the VCO is always present, on each falling edge of signal FEEDBACK_CLOCK, a logic high is transferred from the input data terminal of flip-flop 22 to its output terminal. In other words, with each falling edge of signal FEEDBACK_CLOCK, signal V1A goes high. Because signal RISING is applied to the CLR terminal of flip-flop 22, with each rising edge of signal RISING, V1A is reset to zero. For example, in response to falling edge 402 of signal FEEDBACK_CLOCK, signal V1A goes high 404, and in response to rising edge 406 of signal RISING, signal V1A goes low 408. In response to edge 410 of signal FEEDBACK_CLOCK, signal V1A goes high 412. On the next falling edge 414 of signal FEEDBACK_CLOCK, the high level of signal V1A causes signal V1B to go high 416, which in turn causes NOR gate 38, NAND gate 42 and NOR gates 44 and 46 to set signal ALARM to a high level 450 to indicate detection of the missing pulse on the reference clock signal CLK. In response to the next rising edge 418 of the reference clock signal REF, signal RISING goes high 420, thereby causing signal V1A to go low 422. On the next falling edge 424 of signal FEEDBACK_CLOCK, the low level of signal V1A causes signal V1B to go low 426.

Figure 5:
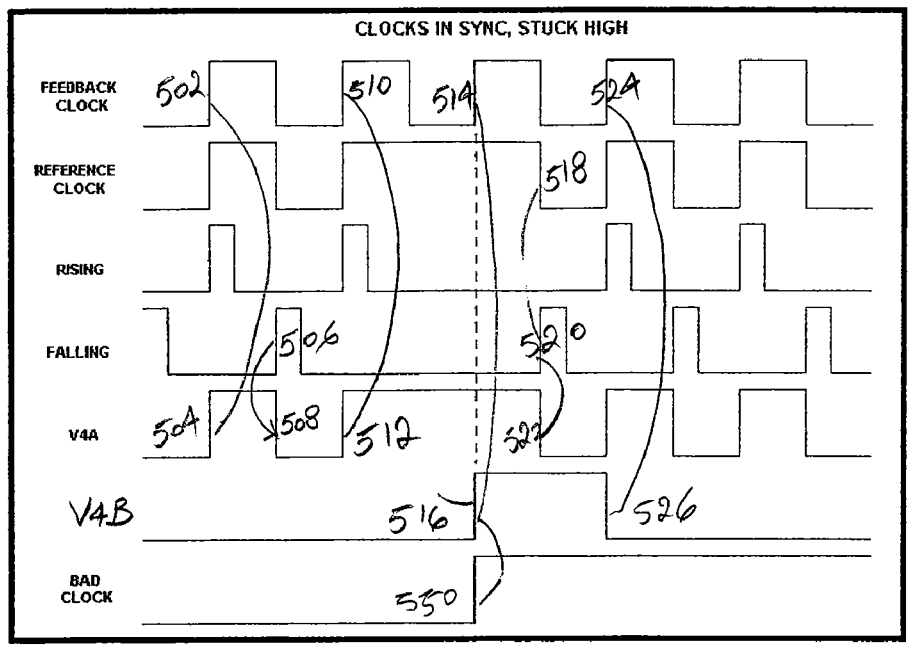
FIG. 5 is a timing diagram of a number of signals associated with circuit of FIG. 3 when the reference clock signal is initially in sync with the feedback clock signal but is subsequently stuck in a low level.

FIG. 5 is a timing diagram of a number of signals associated with circuit 150 when the reference clock REF is initially in sync with the feedback clock FEEDBACK_CLOCK but is subsequently stuck in a high level. Referring concurrently to FIGS. 3 and 5, with each rising edge of the reference clock signal REF, a RISING pulse is generated. Similarly, with each falling edge of the reference clock signal REF, a FALLING pulse is generated. Because the feedback clock signal generated by the VCO is always present, on each falling edge of signal FEEDBACK_CLOCK, a logic high is transferred from the input data terminal of flip-flop 34 to its output terminal. In other words, with each falling edge of signal FEEDBACK_CLOCK, signal V4A goes high. Because signal FALLING is applied to the CLR terminal of flip-flop 34, with each rising edge of signal FALLING, signal V4A is reset to zero. For example, in response to rising edge 502 of signal FEEDBACK_CLOCK, signal V4A goes high 504, and in response to rising edge 506 of signal FALLING, signal V4A goes low 508. In response to edge 510 of signal FEEDBACK_CLOCK, signal V4A goes high 512. On the next rising edge 514 of signal FEEDBACK_CLOCK, the high level of signal V4A causes signal V4B to go high 516, which in turn causes NOR gate 40, NAND gate 42 and NOR gates 44 and 46 to set signal ALARM to a high level 550 to indicate detection of the missing pulse on the reference clock signal CLK. In response to the next falling edge 518 of the reference clock signal REF, signal FALLING goes high 520, thereby causing signal V4A to go low 522. On the next rising edge 524 of signal FEEDBACK_CLOCK, the low level of signal V4A causes signal V4B to go low 526.

Figure 6:
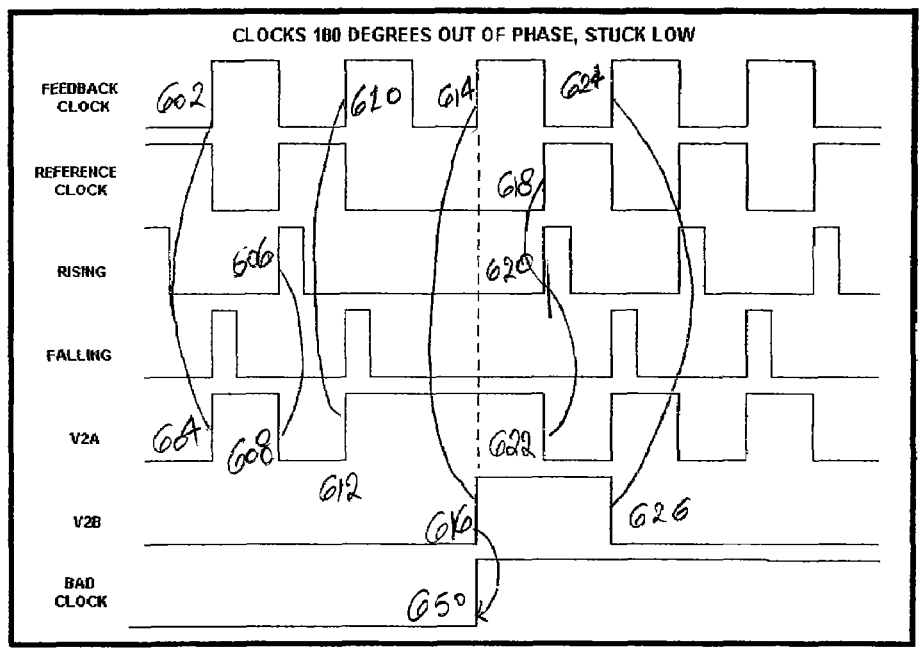
FIG. 6 is a timing diagram of a number of signals associated with circuit of FIG. 3 when the reference clock signal is initially 180 degrees out of phase with respect to the feedback clock signal but is subsequently stuck in a low level.

FIG. 6 is a timing diagram of a number of signals associated with circuit 150 when the reference clock REF is initially 180 degrees out of phase with respect to the feedback clock FEEDBACK_CLOCK but is subsequently stuck in a low level. Referring concurrently to FIGS. 3 and 6, with each rising edge of the reference clock signal REF, a RISING pulse is generated. Similarly, with each falling edge of the reference clock signal REF, a FALLING pulse is generated. Because the feedback clock signal generated by the VCO is always present, on each rising edge of signal FEEDBACK_CLOCK, a logic high is transferred from the input data terminal of flip-flop 26 to its output terminal. In other words, with each rising edge of signal FEEDBACK_CLOCK, signal V2A goes high. Because signal RISING is applied to the CLR terminal of flip-flop 26, with each rising edge of signal RISING, signal V2A is reset to zero. For example, in response to rising edge 602 of signal FEEDBACK_CLOCK, signal V2A goes high 604, and in response to rising edge 606 of signal RISING, signal V2A goes low 608. In response to edge 610 of signal FEEDBACK_CLOCK, signal V2A goes high 612. On the next rising edge 614 of signal FEEDBACK_CLOCK, the high level of signal V2A causes signal V2B to go high 616, which in turn causes NOR gate 38, NAND gate 42 and NOR gates 44 and 46 to set signal ALARM to a high level 650 to indicate detection of the missing pulse on the reference clock signal CLK. In response to the next rising edge 618 of the reference clock signal REF, signal RISING goes high 620, thereby causing signal V2A to go low 622. On the next rising edge 624 of signal FEEDBACK_CLOCK, the low level of signal V2A causes signal V2B to go low 626.

Figure 7:
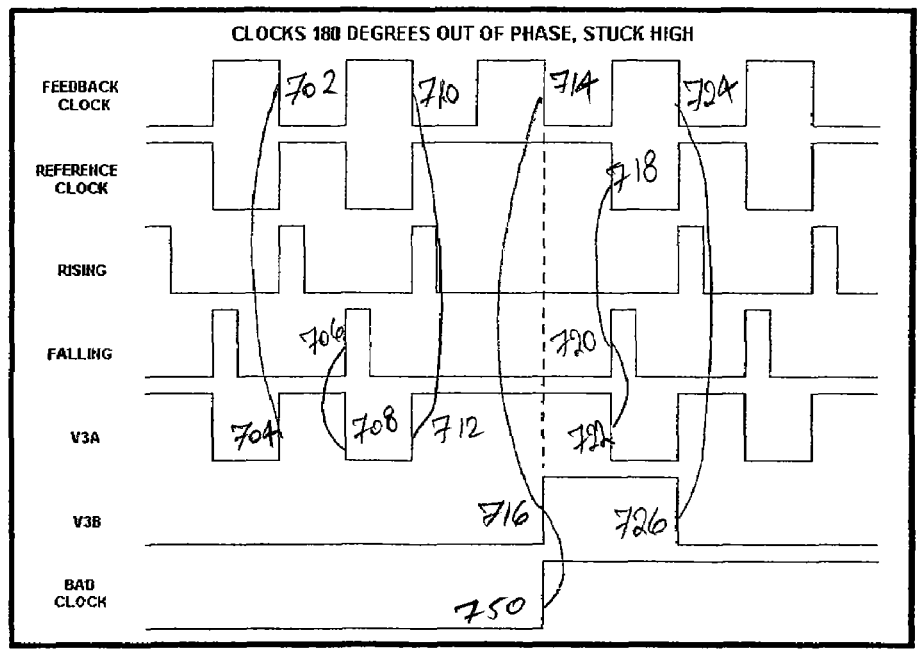
FIG. 7 is a timing diagram of a number of signals associated with circuit of FIG. 3 when the reference clock signal is initially 180 degrees out of phase with respect to the feedback clock signal but is subsequently stuck in a high level.

FIG. 7 is a timing diagram of a number of signals associated with circuit 150 when the reference clock REF is initially 180 degrees out of phase with respect to the feedback clock FEEDBACK_CLOCK but is subsequently stuck in a high level. Referring concurrently to FIGS. 3 and 7, with each rising edge of the reference clock signal REF, a RISING pulse is generated. Similarly, with each falling edge of the reference clock signal REF, a FALLING pulse is generated. Because the feedback clock signal generated by the VCO is always present, on each falling edge of signal FEEDBACK_CLOCK, a logic high is transferred from the input data terminal of flip-flop 30 to its output terminal. In other words, with each falling edge of signal FEEDBACK_CLOCK, signal V3A goes high. Because signal FALLING is applied to the CLR terminal of flip-flop 30, with each rising edge of signal FALLING, signal V3A is reset to zero. For example, in response to falling edge 702 of signal FEEDBACK_CLOCK, signal V3A goes high 704, and in response to rising edge 706 of signal FALLING, signal V3A goes low 708. In response to edge 710 of signal FEEDBACK_CLOCK, signal V3A goes high 712. On the next falling edge 714 of signal FEEDBACK_CLOCK, the high level of signal V3A causes signal V3B to go high 716, which in turn causes NOR gate 40, NAND gate 42 and NOR gates 44 and 46 to set signal ALARM to a high level 750 to indicate detection of the missing pulse on the reference clock signal CLK. In response to the next falling edge 718 of the reference clock signal REF, signal FALLING goes high 720, thereby causing signal V3A to go low 722. On the next falling edge 724 of signal FEEDBACK_CLOCK, the low level of signal V3A causes signal V3B to go low 726. Referring to FIGS. 4-7, it is seen that signal ALARM is set half a clock cycle after a missing pulse occurs on signal REF.

FIG. 8 is a schematic diagram of a PLL 200, in accordance with one embodiment of the present invention. PLL 200 is shown as including a phase/frequency detector 202, missing pulse detection circuit 150 (see FIG. 3), pulse-width limiters 204, 206, 208 and OR gate 210. Pulse-width limiter 206 limits the width of signal DN received from phase/frequency detector 202 to generate signal DN_X. Pulse-width limiter 204 limits the width of signal UP_L received from phase/frequency detector 202 to generate signal UP_L. Pulse-width limiter 208 limits the width of signal ALARM received from circuit 150 shown in FIG. 3 to generate signal ALARM_L.

FIG. 9 is a timing diagram of a number of signal associated with PLL 200. Reference clock signal REF is shown as having missing pulses. Because transitions 900 and 902 of signals FEEDBACK_CLOCK and REF are aligned, phase/frequency detector 202 generates both UP and DN pulses 904, 906. Accordingly, pulses 908 and 910 also appear on signals UP_X and DN_X. Similarly, because transitions 930 and 932 of signals CLK and REF are aligned, phase/frequency detector 102 generates both UP and DN pulses 934, 936, in response to which, pulses 938 and 940 appear on signals UP_X and DN_X.

Since there is no transition on signal REF during the next two cycles of signal CLK, signal DN goes high 952 in response to transition 950 of signal CLK. Accordingly, pulse width limiter 206 generates pulse 954 on signal DN_X. Because reference clock signal REF was in sync with feedback clock signal FEEDBACK_CLOCK before being stuck at a low level, on the next falling edge 952 of signal FEEDBACK_CLOCK, pulse-width detection circuit 150 causes signal ALARM to go high 956, as was described in detail above with references to FIGS. 3 and 4. In response, pulse width limiter 208 generates a pulse 956 on signal ALARM_L, which in turn causes a pulse 958 to appear on signal UP_X. Pulse 958 of signal UP_X reduces the phase bump generated as a result of pulse 954 on signal DN_X.

The above embodiments of the present invention are illustrative and not limiting. Various alternatives and equivalents are possible. The invention is not limited by the type of pulse-width limiting, slew detection, etc. The invention is not limited by the number of current sources or current sinks. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A phase/frequency locked loop (PLL) comprising:
   a first flip-flop having a data input terminal responsive to a voltage supply, and a clock terminal responsive to an inverse of feedback clock;

a second flip-flop having a data input terminal responsive to an output of the first flip-flop, and a clock terminal responsive to the inverse of the feedback clock;

a first one-shot block adapted to generate a pulse in response to a rising edge of a reference clock, said reference clock being used to generate the feedback clock, said first one-shot block generating an output signal applied to a reset terminal of the first flip-flop;

a third flip-flop having a data input terminal responsive to the voltage supply, and a clock terminal responsive to the feedback clock;

a fourth flip-flop having a data input terminal responsive to an output of the third flip-flop and a clock terminal responsive to the feedback clock; wherein a reset terminal of the third flip-flop receives the output signal of the first one-shot block; and a fifth flip-flop having a data input terminal responsive to the voltage supply, and a clock terminal responsive to the inverse of feedback clock;

a sixth flip-flop having a data input terminal responsive to an output of the fifth flip-flop, and a clock terminal responsive to the inverse of the feedback clock; and a second one-shot block adapted to generate a pulse in response to a falling edge of the reference clock, said second one-shot block generating an output signal applied to a reset terminal of the fifth flip-flop.

2. The PLL of claim 1 further comprising:
a seventh flip-flop having a data input terminal responsive to the voltage supply, and a clock terminal responsive to the feedback clock; and
an eight flip-flop having a data input terminal responsive to an output of the seventh flip-flop and a clock terminal responsive to the feedback clock; wherein a reset terminal of the seventh flip-flop receives the output signal of the second one-shot block.

3. The PLL of claim 2 further comprising:
a first logic gate performing a NOR operation on output signals of the second and fourth flip-flops;
a second logic gate performing a NOR operation on output signals of the sixth and eight flip-flops;
a third logic gate performing a NAND operation on output signals of the first and second logic gates; and
cross-coupled NOR logic responsive to an output of the third logic gate.

4. The PLL of claim 3 wherein reset terminals of the second, fourth, sixth and eight flip-flops are responsive to an reset signal to which said cross-coupled NOR logic is also responsive.

5. The PLL of claim 4 further comprising:
a phase/frequency detector responsive to a phase/frequency of each said feedback and the reference clock;
a first pulse-width limiter adapted to generate a second pulse in response to a first output of the phase/frequency detector;
a second pulse-width limiter adapted to generate a third pulse in response to a second output of the phase/frequency detector; and
a third pulse-width limiter adapted to generate a fourth pulse in response to the reset signal; and
a fourth logic gate performing and OR operation on said second and fourth pulses.

6. The PLL of claim 5 further comprising:
a charge pump responsive to the second pulse and the fourth logic gate; and an oscillator adapted to generate the feedback clock in response to the charge pump.

7. A method comprising:
supplying a voltage to a data input terminal of a first flip-flop;
applying an output signal of the first flip-flop to a data input terminal of a second flip-flop;
applying an inverse of a feedback clock to clock terminals of the first and second flip-flops;
generating a pulse in response to a rising edge of a reference clock;
generating the feedback clock from the reference clock;
resetting the first flip-flop in response to the pulse;
supplying the voltage to a data input terminal of a third flip-flop;
applying an output signal of the third flip-flop to a data input terminal of a fourth flip-flop;
applying the feedback clock to clock terminals of the third and fourth flip-flops;
resetting the third flip-flop in response to the pulse; and
supplying the voltage to a data input terminal of a fifth flip-flop;
applying an output signal of the fifth flip-flop to a data input terminal of a sixth flip-flop;
applying the inverse of the feedback clock to clock terminals of the fifth and sixth flip-flops; and
resetting the fifth flip-flop in response to the pulse.

8. The method of claim 7 further comprising:
supplying the voltage to a data input terminal of a seventh flip-flop;
applying an output signal of the seventh flip-flop to a data input terminal of an eight flip-flop;
applying the feedback clock to clock terminals of the seventh and eight flip-flops; and
resetting the seventh flip-flop in response to the pulse.

9. The method of claim 8 further comprising:
performing a NOR operation on output signals of the second and fourth flip-flops;
performing a NOR operation on output signals of the sixth and eight flip-flops;
performing a NAND operation on output signals of the first and second logic gates; and
applying a result of the NAND operation to an input of a cross-coupled NOR gate.

10. The method of claim 9 further comprising:
resetting the second, fourth, sixth and eight flip-flops in response to a reset signal; and
applying the reset signal to the cross-coupled NOR gate.

11. The method of claim 10 further comprising:
detecting a difference between phases/frequencies of said feedback and the reference clock;
generating a second pulse in response to the detected difference;
generating a third pulse in response to the detected difference;
generating a third pulse in response to the reset signal; and
performing and OR operation the second and fourth pulses.

12. The method of claim 11 further comprising:
varying a voltage/current level in response to an output of the second pulse and the OR operation; and
generating the feedback clock in response to the varied voltage/current level.

* * * * *